United States Patent [19]
Okamoto et al.

[11] Patent Number: 5,611,067
[45] Date of Patent: Mar. 11, 1997

[54] NONVOLATILE SEMICONDUCTOR MEMORY DEVICE HAVING MEANS FOR SELECTIVE TRANSFER OF MEMORY BLOCK CONTENTS AND FOR CHAINING TOGETHER UNUSED MEMORY BLOCKS

[75] Inventors: Yutaka Okamoto, Kawasaki; Yoshiyuki Tanaka, Tokyo, both of Japan

[73] Assignee: Kabushiki Kaisha Toshiba, Kawasaki, Japan

[21] Appl. No.: 38,837

[22] Filed: Mar. 29, 1993

[30] Foreign Application Priority Data

Mar. 31, 1992 [JP] Japan ..................... 4-077940

[51] Int. Cl.⁶ ............. G06F 12/00; G11C 16/00
[52] U.S. Cl. .......... 395/430; 395/481; 365/218; 365/230.03
[58] Field of Search ............... 395/425, 500, 395/430, 481; 364/251.5, 957.3, 960.1, 965.76; 365/185, 218, 185.11

[56] References Cited

U.S. PATENT DOCUMENTS

| | | | |
|---|---|---|---|
| 3,241,125 | 3/1966 | Tomasulo et al. | 395/497.04 |
| 4,685,057 | 8/1987 | Lemone et al. | 395/421.11 |
| 4,755,939 | 7/1988 | Watson | 395/600 |
| 4,912,629 | 3/1990 | Shuler, Jr. | 395/600 |
| 5,023,813 | 6/1991 | Brown, III | 395/116 |
| 5,095,512 | 3/1992 | Roberts et al. | 382/56 |
| 5,200,959 | 4/1993 | Gross et al. | 371/21.6 |
| 5,268,870 | 12/1993 | Harari | 365/218 |
| 5,270,979 | 12/1993 | Harari et al. | 365/218 |
| 5,291,584 | 3/1994 | Challa et al. | 395/500 |
| 5,293,560 | 3/1994 | Harari | 365/185 |
| 5,297,148 | 3/1994 | Harari et al. | 371/10.2 |
| 5,357,475 | 10/1994 | Hasbun et al. | 365/218 |

FOREIGN PATENT DOCUMENTS

| | | |
|---|---|---|
| 0392895 | 10/1990 | European Pat. Off. . |
| 2-292798 | 12/1990 | Japan . |
| 3-8199 | 1/1991 | Japan . |
| 3-167644 | 7/1991 | Japan . |
| 3-250498 | 11/1991 | Japan . |

*Primary Examiner*—Jack A. Lane
*Attorney, Agent, or Firm*—Oblon, Spivak, McClelland, Maier & Neustadt, P.C.

[57] ABSTRACT

A nonvolatile semiconductor memory device using a NAND-type EEPROM includes a memory unit, a management unit, an erasure unit, and a control unit. The memory unit has a memory cell array divided into blocks each constituting a minimum quantity of data that may be erased. The management unit manages unused blocks. The erasure unit discriminates erased blocks of the unused blocks from non-erased blocks of the unused blocks to erase data stored in the non-erased blocks. The control unit writes data into at least one block of the unused blocks managed by the management unit. In the control unit, when a content of the written data is obtained by changing data recorded in a different block of the memory unit, and the data recorded on the another block is not necessary, the management unit receives information that the different block is an unused block. When the data recorded in the different block is necessary, a necessary part of the data recorded in the different block is copied to a block in which new data is to be written.

21 Claims, 18 Drawing Sheets

FIG. 4
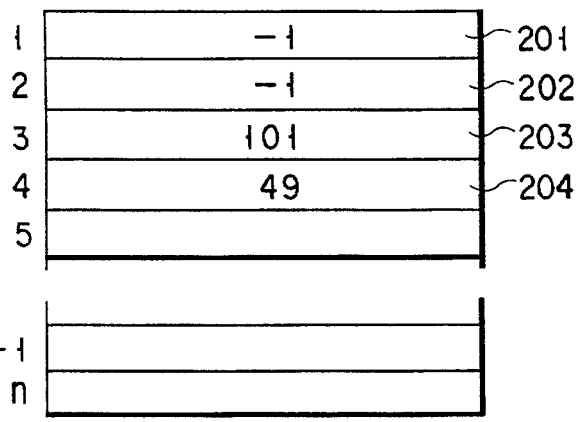
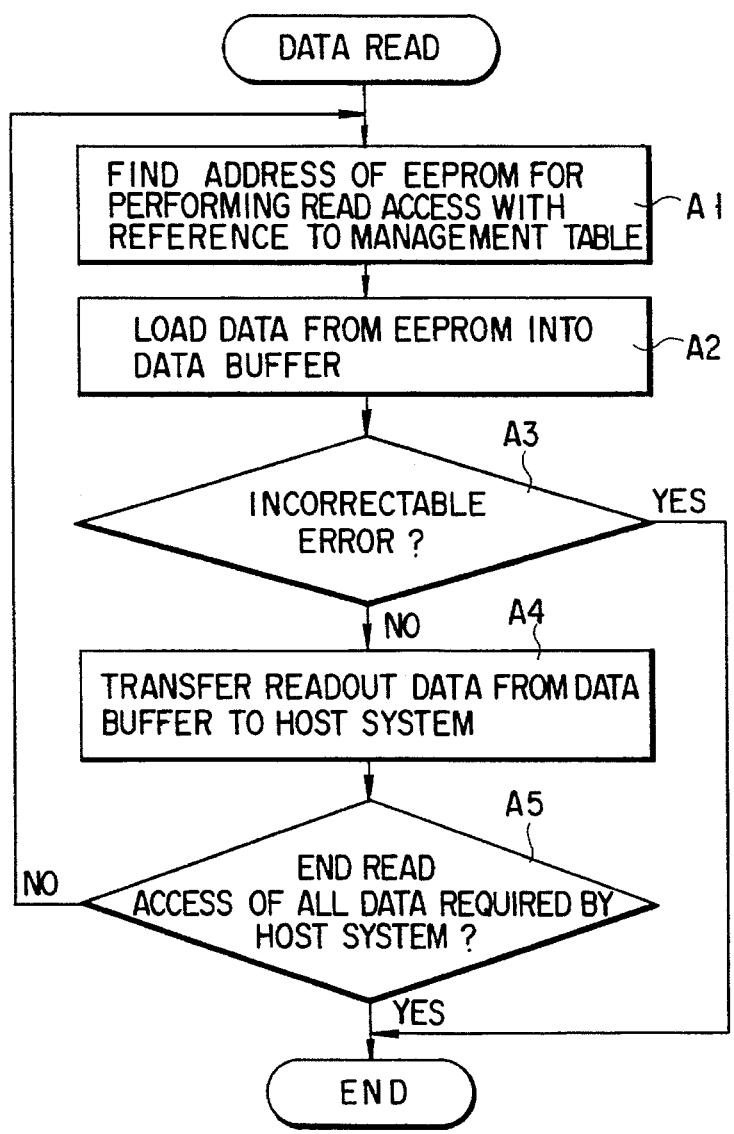
FIG. 5

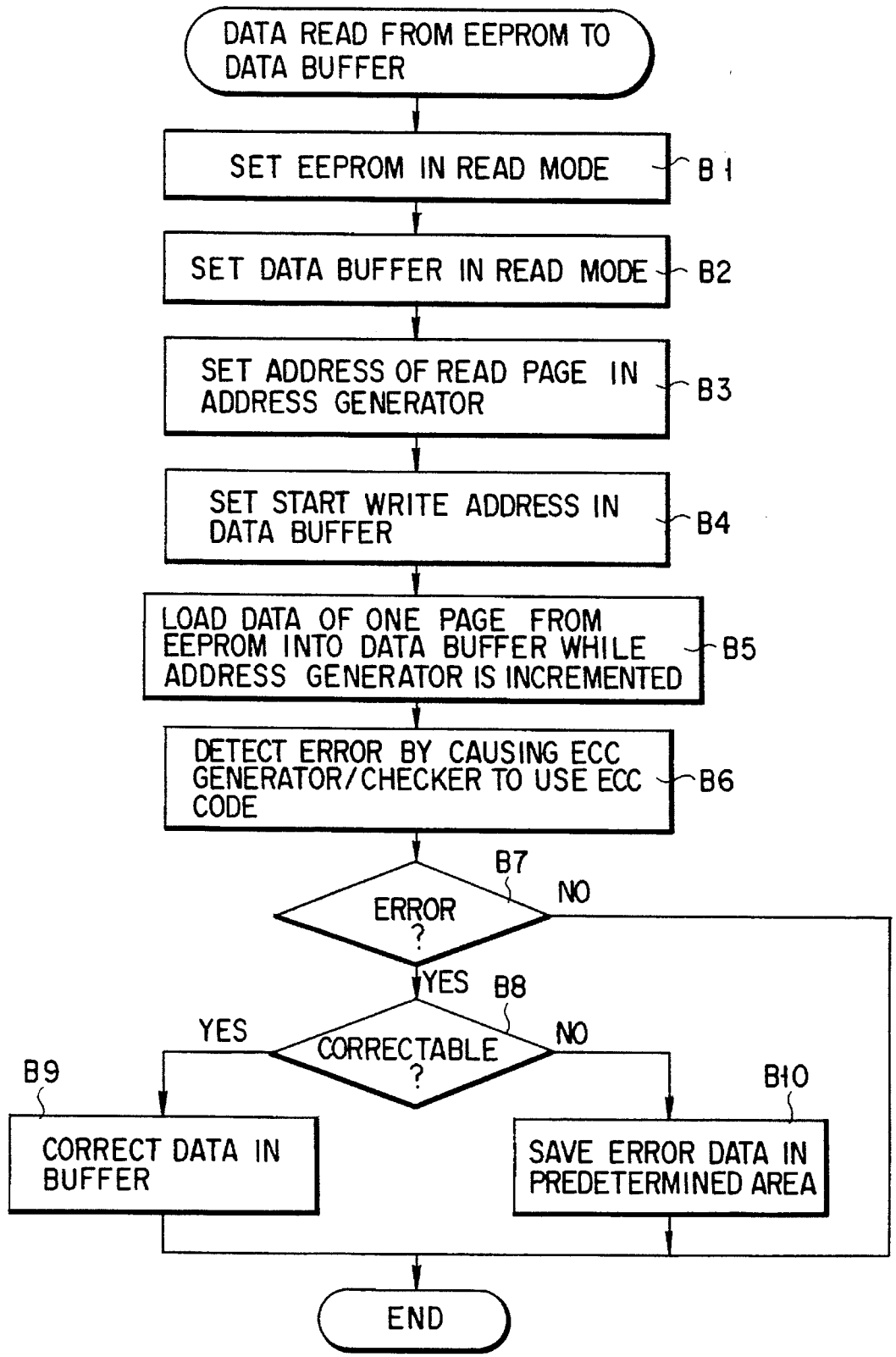
F I G. 6

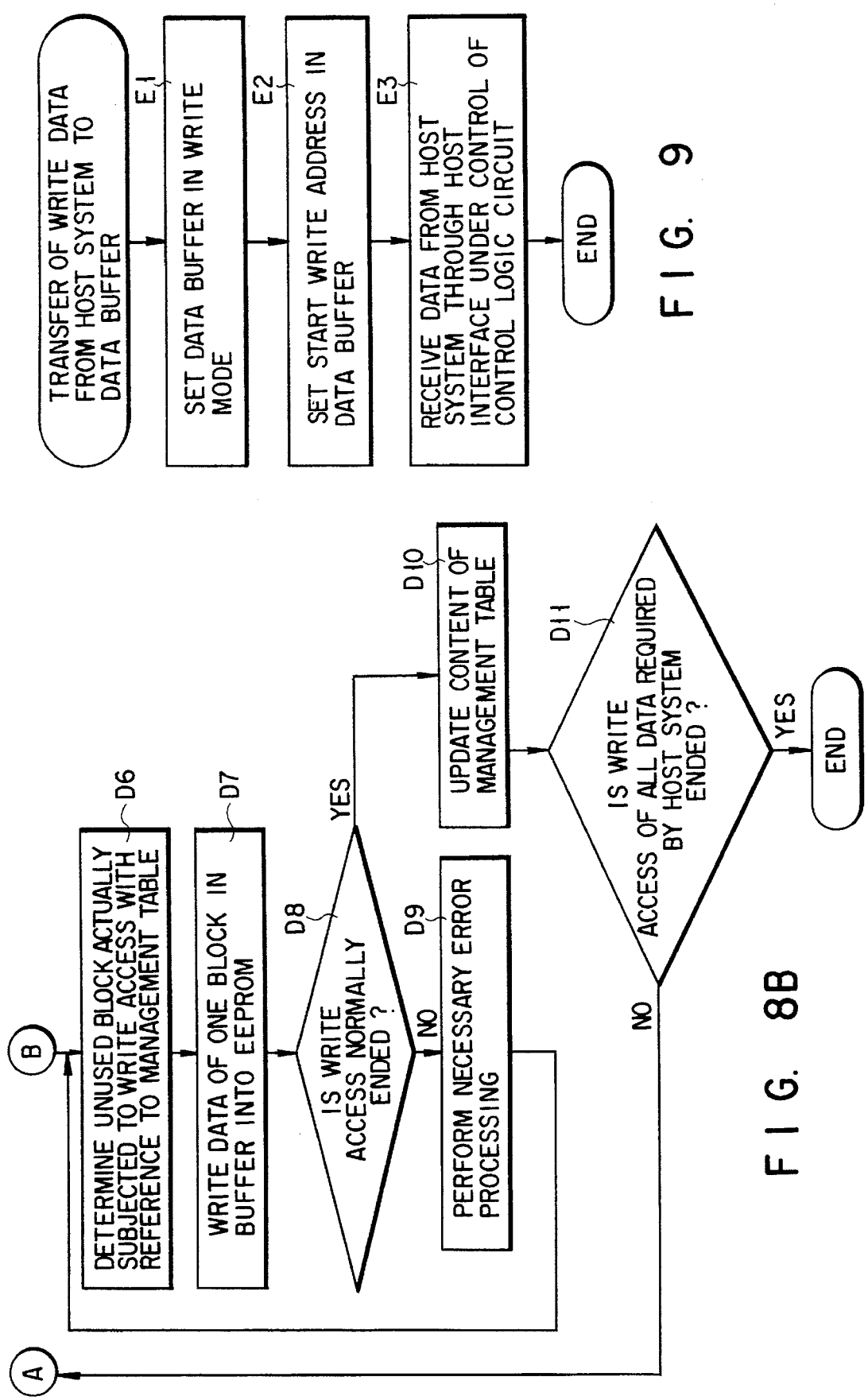

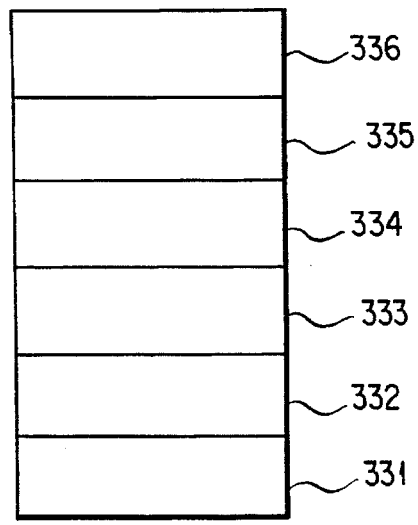
F I G. 11
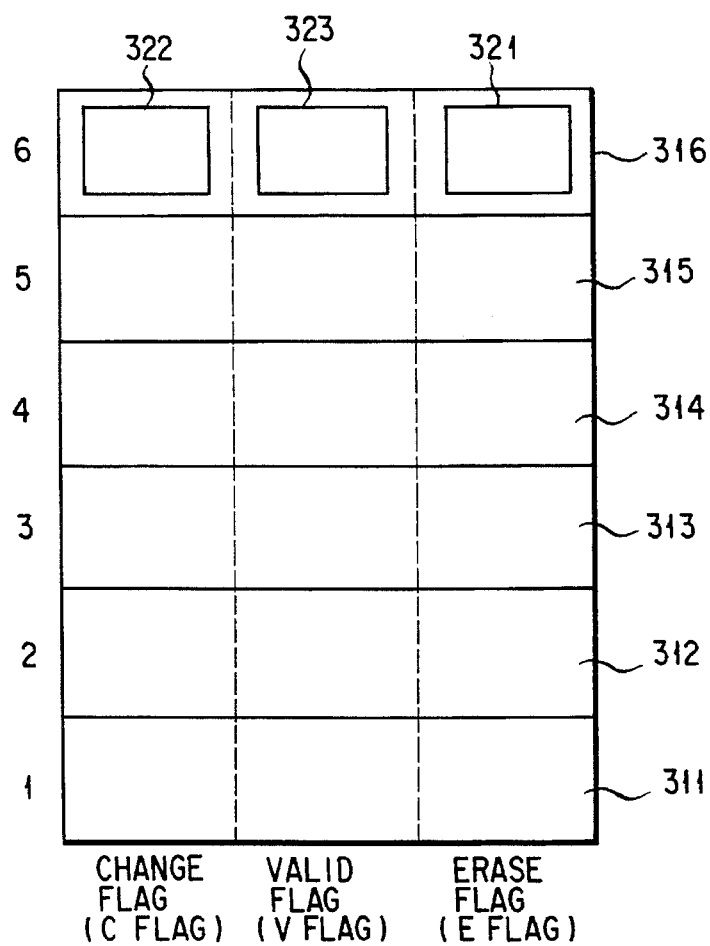
F I G. 12

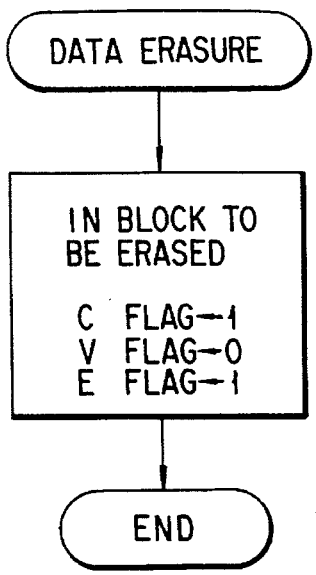
F I G. 14
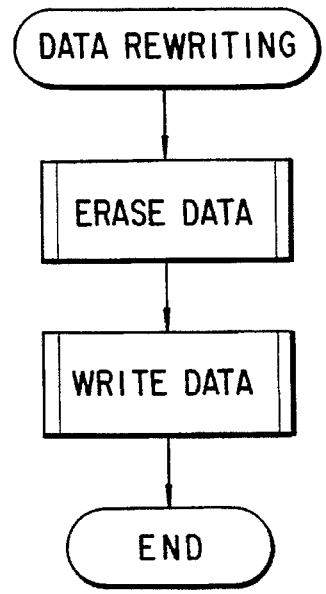
F I G. 15
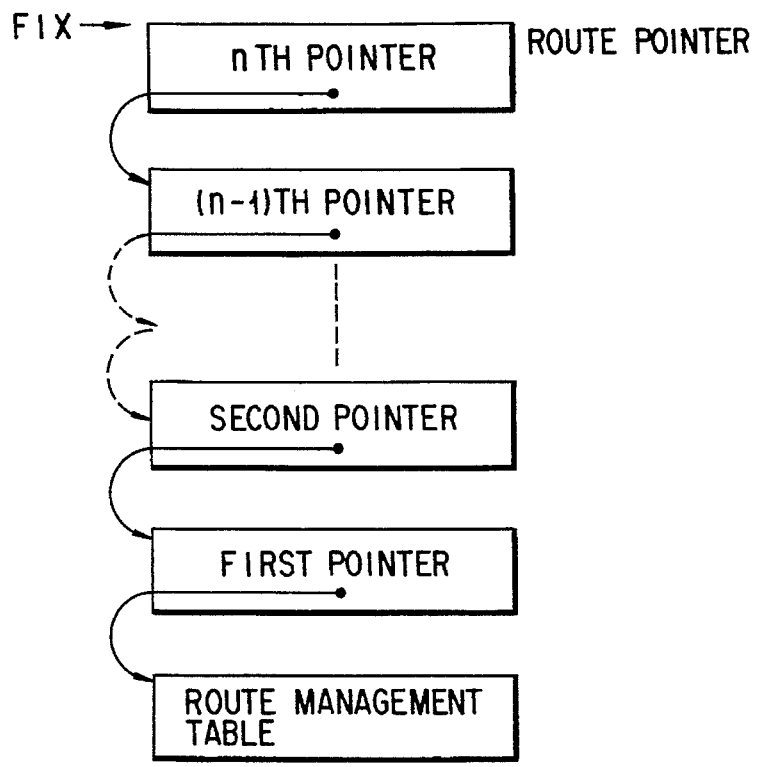
F I G. 19

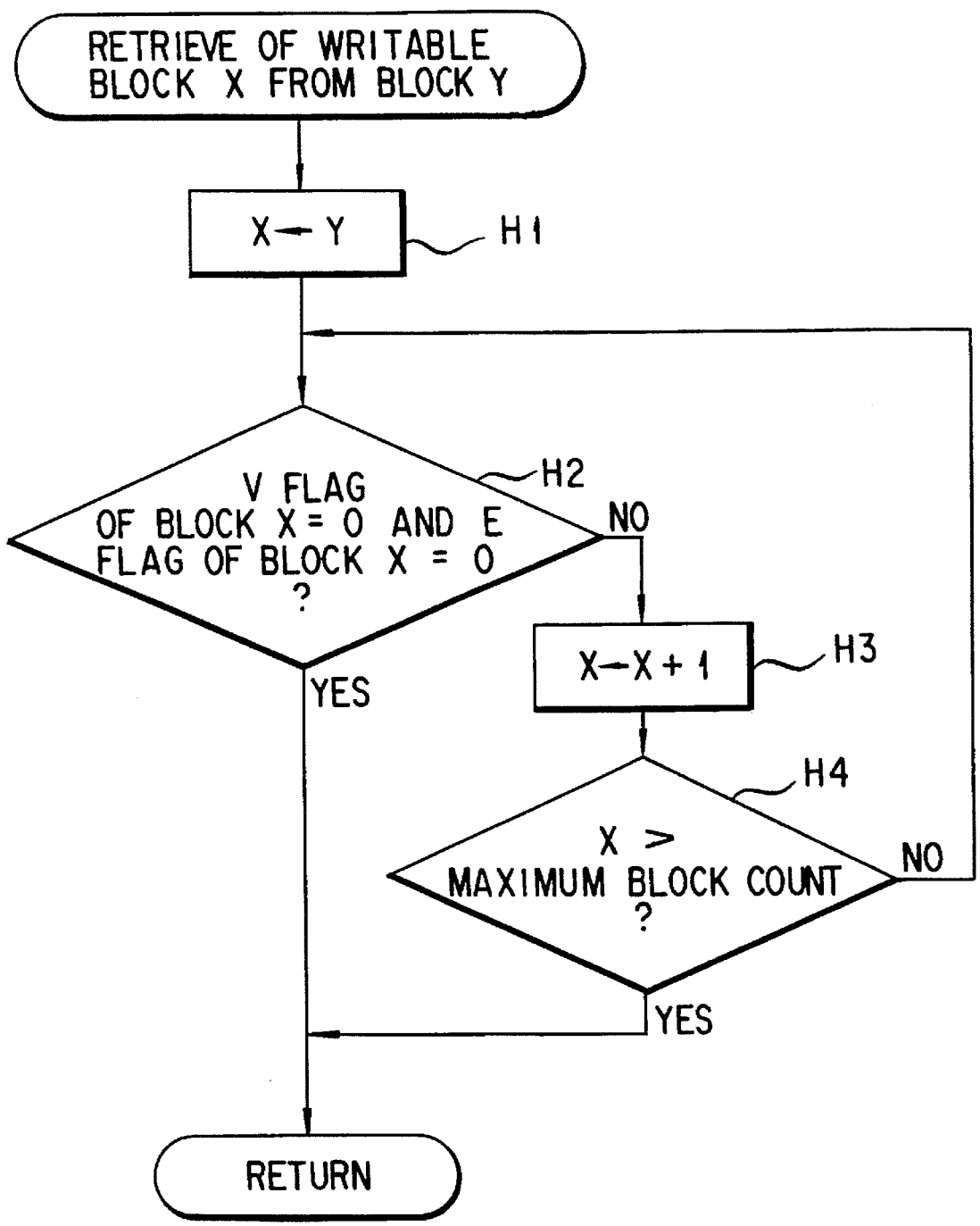
F I G. 16

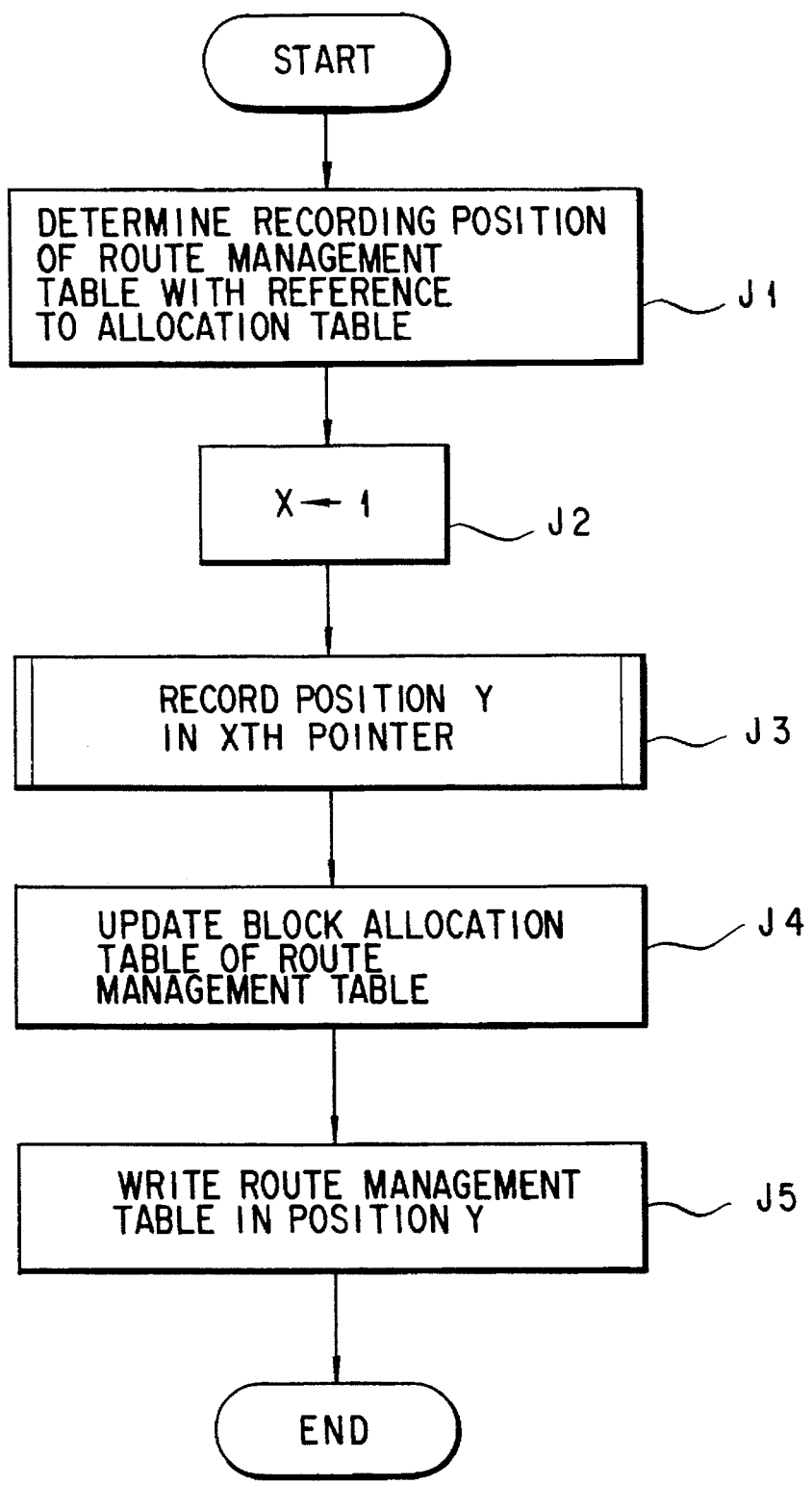
F I G. 22

NONVOLATILE SEMICONDUCTOR MEMORY DEVICE HAVING MEANS FOR SELECTIVE TRANSFER OF MEMORY BLOCK CONTENTS AND FOR CHAINING TOGETHER UNUSED MEMORY BLOCKS

BACKGROUND OF THE INVENTION

1. Field of the Invention

The present invention relates to a nonvolatile semiconductor memory device using a NAND-type EEPROM in an electrically erasable programmable nonvolatile semiconductor memory (EEPROM).

2. Description of the Related Art

In a computer system, a programmable memory device (or memory) generally has a physically limited capacity and is used such that new data is overwritten on unnecessary data. Programmable memory devices (memories) can be classified into two types of programmable memory devices according to overwrite methods. In one type of memory device, as in a random access memory (RAM), a hard disk, a floppy disk, or a magnetic tape, new data can be directly overwritten on old data. In the other type of memory device, as in a certain type of optical memory device or an EEPROM, after old data on which new data is to be overwritten is erased, the new data can be written.

A NAND-type EEPROM has two types of erasing methods. According to the first method, as in, e.g., a flash EEPROM available from INTEL CORP., data on an entire chip is erased at once. According to the second method, only data on part of a chip is selectively erased.

In the NAND-type EEPROM, a plurality of structurally continued memory cells for continuously reading data or writing data is called a page as a unit. For example, in a 4-Mbit EEPROM, one page is constituted by memory cells having 4096 bits. The plurality of structurally continued pages are called a block as a unit. For example, in a 4-Mbit EEPROM, one block is constituted by memory cells of 8 pages (4 kbytes). In a NAND-type EEPROM, a unit used when only data on part of one chip is selectively erased coincides with the block.

Since the NAND-type EEPROM can partially erase data as described above, the NAND-type EEPROM is a nonvolatile semiconductor memory capable of relatively easily performing an operation in which data of one sector can be rewritten. Therefore, the characteristic features of a semiconductor memory such as reliability related to a mechanical strength, low power consumption, and a short read access time are effectively utilized, and the NAND-type EEPROM has been used in applications where a conventional magnetic disk device is taken over.

However, although an access time for reading out data is short in the EEPROM, an access time for writing data is long. For example, in a 4-Mbit NAND-type EEPROM, although a time required for reading out data of one block is about 490 μsec, and times required for erasing data of one block and writing new data of one block are about 10 msec for erasure and about 4 msec for write access.

In addition, according to the current technique, a maximum rewrite count is limited. When a rewriting operation is performed $10^4$ or $10^5$ times, the EEPROM reaches the end of its service life. Therefore, when an overwriting operation of data is concentrated on the same block, the service life of an entire chip is shortened.

As in file management performed by an OS, a file may be generally recorded in any empty area of a data area, and the empty area is managed by a directory and a management table such as a File Allocation Table (FAT). This file management is applied to an EEPROM having a limited maximum rewrite count, and positions in which files are to be written can be easily distributed to prevent a rewriting operation from being concentrated on the same position. However, when a file is written or rewritten, the content of a file management table must be rewritten, and the frequency of rewriting of these table data is considerably higher than that of writing of data files. Furthermore, the content of the management table must always be recorded on a fixed position. Therefore, when an EEPROM is applied to a file memory device, a rewriting operation is concentrated on the area of the management table area, and the service life of the EEPROM may be shortened.

The related arts of the present invention are disclosed in Published Unexamined Japanese Patent Application No. 2-292798 and Published Unexamined Japanese Patent Application No. 3-167644.

SUMMARY OF THE INVENTION

It is an object of the present invention to provide a nonvolatile semiconductor memory device capable of performing write access at high speed and prolonging the service life of the nonvolatile semiconductor memory device.

The first nonvolatile semiconductor memory device of the present invention is a nonvolatile semiconductor memory device using a NAND-type EEPROM and is characterized by comprising memory means having a memory cell array divided into a plurality of blocks, one block of the plurality of blocks being constituted as a minimum erasure unit of data; managing means for managing unused blocks of the plurality of blocks; erasing means for discriminating a data-erased block of the unused blocks from a data-non-erased block of the unused blocks to erase data of the data-non-erased block; and control means for writing data in at least one block of the unused blocks managed by the managing means, when a content of the written data is obtained by changing data recorded in another block of the memory means, and the data recorded in the another block is not necessary, informing the managing means that the another block is an unused block, and for, when the data recorded in the another block is necessary, copying a necessary part of the data recorded in the another block to a block in which new data is to be written.

According to the first nonvolatile semiconductor memory device, write access of new data is performed in an unused block area having data which is erased in advance as much as possible. In this manner, an erasure operation which must be performed prior to write access and which inevitably increases an access time can be omitted, high-speed write access can be performed. When the same data is to be updated/changed, a physical writing position is changed every time write access is performed, and an increase in write count to a specific block is prevented. Therefore, a long service life can be assured.

The second nonvolatile semiconductor memory device of the present invention is a nonvolatile semiconductor memory device using a NAND-type EEPROM and is characterized by comprising memory means having a plurality of divided storage areas having predetermined capacities serving as units of management, first managing means for performing management such that the plurality of storage areas are circularly used in one direction in accordance with a physical or logical arrangement in write access of data in the plurality of storage areas, second managing means for managing whether data recorded in the plurality of storage areas are changed after a predetermined timing, and control means for selecting a storage area having data which is not changed after a timing when the second managing means is initialized, at a timing when a condition predetermined by write access of data is satisfied, moving the data in the selected storage area to another storage area and initializing the second managing means when data in all the storage areas are assumed to be changed. In addition, the second nonvolatile semiconductor memory device characterized in that the timing when the predetermined condition is satisfied is a timing when one circulation cycle managed by the first managing means is ended.

According to the second nonvolatile semiconductor memory device, since write access of data is circulated with respect to the plurality of storage areas in one direction, the write access is not concentrated on a specific storage area and is uniformly performed in all the plurality of storage areas. After the write access is performed, data kept stored in the same area without being changed for a long time is moved such that the write counts of all the plurality of storage areas are equal to each other. For this reason, an apparent writing area is not narrowed, and the service life of the memory device is not shortened. Therefore, although a maximum rewrite count of the same area is limited, the memory device can have the service life equal to that of a magnetic disk, and the memory device can be used in a variety of applications. In addition, a storage area having written data which is not changed is selected by one circulation cycle of write access, so that the apparent writing area can be more properly prevented from being narrowed.

The third nonvolatile semiconductor memory device of the present invention is a nonvolatile semiconductor memory device using NAND-type EEPROM and is characterized by comprising a file, a management table for managing a recording position of the file, memory means for storing the management table and pointers constituted to hierarchically represent the file recording positions in a plurality of levels, and control means for controlling to fix only a recording position of a route pointer as a route of the pointers in the plurality of levels while a recording position of the management table is not fixed in the memory means.

According to the third nonvolatile semiconductor memory device, a recording position in the memory means of the frequently rewritten management table is not fixed, and pointers representing the position of the management table are hierarchically recorded in a plurality of levels. For this reason, a write count of the pointer which must be recorded at a fixed position to retrieve the pointer can be suppressed to the same count as the rewrite count of any other area. Therefore, write access is not concentrated on a specific storage area, and the service life of the memory device is not prevented from being shortened.

Additional objects and advantages of the present invention will be set forth in the description which follows, and in part will be obvious from the description, or may be learned by practice of the present invention. The objects and advantages of the present invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the present invention and, together with the general description given above and the detailed description of the preferred embodiments given below, serve to explain the principles of the present invention in which:

FIG. 4 is a view showing the arrangement of a reference table for address translation in the first embodiment;

FIG. 5 is a flow chart for explaining read processing of data from an EEPROM module in the first embodiment;

FIG. 6 is a flow chart for explaining read processing of data from the EEPROM module to a data buffer in the first embodiment;

FIGS. 8A and 8B are flow charts for explaining write processing of data to the EEPROM module in the first embodiment;

FIG. 9 is a flow chart for explaining transfer processing of write data from the host system to the data buffer;

FIG. 11 is a view showing the arrangement of storage areas of the EEPROM in the second embodiment;

FIG. 12 is a view showing a table arrangement for managing write access to a block in a nonvolatile semiconductor memory device according to the second embodiment of the present invention;

FIG. 14 is a flow chart showing a sequence of erasing data in the second embodiment;

FIG. 15 is a flow chart showing a sequence of rewriting data in the second embodiment;

FIG. 16 is a flow chart showing a subroutine used in the sequence of writing the data in FIG. 13B;

FIGS. 17A to 17F and 18A to 18F are views for explaining changes in states of storage areas and a table for managing the storage areas, which changes are caused by writing data;

FIG. 19 is a view showing a relationship between a pointer and a route management table in the third embodiment of the present invention;

FIG. 22 is a flow chart showing the sequence of processing performed upon updating a route management table in the third embodiment.

DETAILED DESCRIPTION OF THE PREFERRED EMBODIMENTS

A nonvolatile semiconductor memory device according to an embodiment of the present invention will be described with reference to the accompanying drawings. The present invention is applied to a nonvolatile semiconductor memory device using a NAND-type EEPROM.

FIGS. 1 to 10 are views showing the first embodiment of the present invention.

Figure 1:
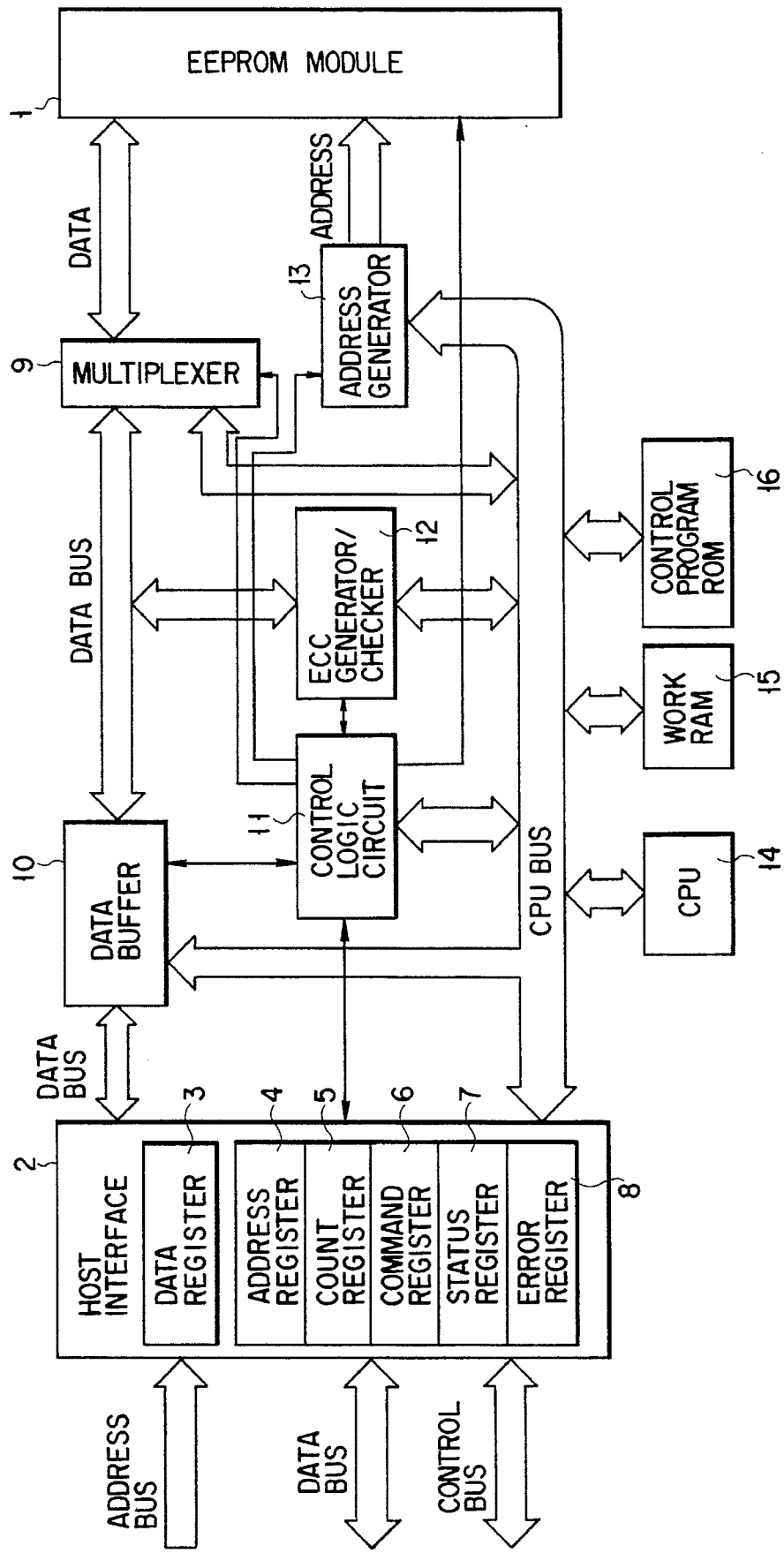
FIG. 1 is a block diagram showing a nonvolatile semiconductor memory device according to the first embodiment of the present invention.

FIG. 1 is a block diagram showing the overall arrangement of a nonvolatile semiconductor memory device (to be referred to as a "memory device" hereinafter) according the first embodiment of the present invention.

In FIG. 1, a NAND-type EEPROM module 1 used as a memory means is constituted by a memory cell array divided into blocks each consisting of a plurality of pages. The EEPROM module 1 is connected to a host system (not shown) through a host interface 2 connected to the module 1 through a data bus. A multiplexer 9 and a data buffer 10 are arranged on the data bus. A data register 3, an address register 4, a count register 5, a command register 6, a status register 7, and an error register 8 are arranged in the host interface 2. In addition, this memory device is constituted by a control logic circuit 11, an ECC (Error Correction Code) generator/checker 12, an address generator 13, a CPU 14 functioning as erasing and control means, a work RAM 15, and a control program ROM 16. A series of control programs for data writing or the like are stored in the control program ROM 16.

The memory device in the first embodiment uses a management table which allocates and manages the position of data recorded in the EEPROM module 1 serving as a nonvolatile memory area. Although this management table is recorded in the EEPROM module 1 together with other user data, the management table is automatically loaded in the work RAM 15 when the operation of the memory device is started. The management table has a content updated every time data is written in the EEPROM module 1, and the updated content of the management table is written in the EEPROM module 1 again every time the content is updated or at a timing when the use of the memory device is ended.

The memory device has two management tables. One management table is a table for managing unused blocks having the arrangement shown in FIG. 2. The other management table is a reference table shown in FIG. 4 for addresses designated by the host system and physical addresses of the memory module.

Figure 2:
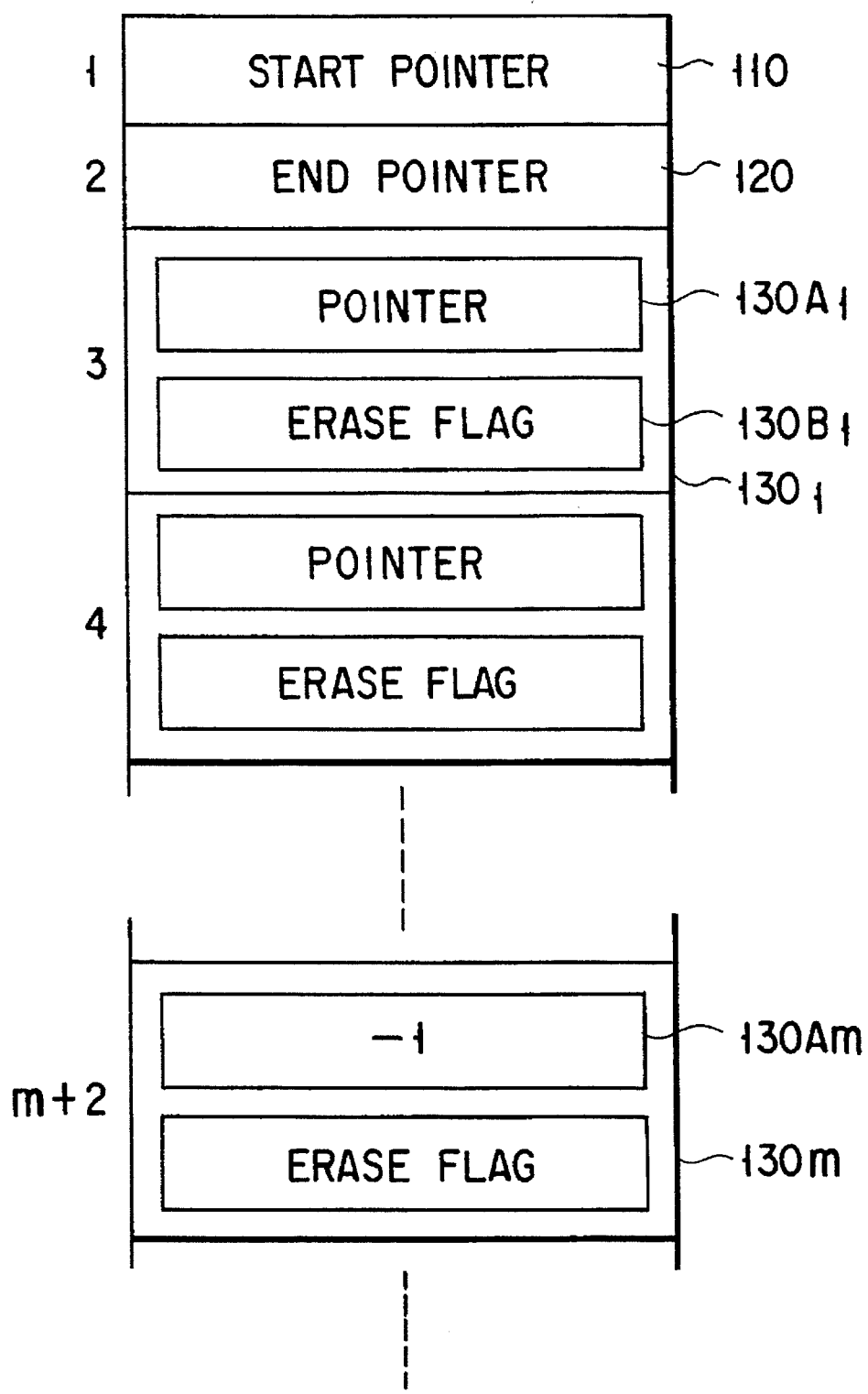
FIG. 2 is a view for explaining an operation of a table for managing an unused block in the first embodiment.

A management table for managing the unused blocks shown in FIG. 2 will be described below. As shown in FIG. 2, the management table consists of a plurality of tables 110, 120, and $130_1$ to $130_m$.

The first table 110 of the management table is a table for managing unused data blocks in a chain form and represents the pointer of the start block of the chain. The second table 120 of the management table is a pointer having the same purpose as that of the first table 110 and represents the end pointer of the chain. The third to (m+2)th tables correspond to the first to m-th physical blocks of the NAND-type EEPROM module 1. Each of the contents of these blocks, as illustrated in the third table $130_1$, is constituted by a pointer $130A_1$ for a next unused block and an erase flag $130B_1$. The erase flag $130B_1$ set to be "0" represents an erased state, and the erase flag $130B_1$ set to be "1" represents a non-erased state. As in a pointer $130A_m$ in a (m+2)th table $130_m$ of the management table, when a pointer having a content set to be "−1" represents the end of the pointer chain. Therefore, in this case, the end pointer points the (m+2)th table $130_m$ of the management table, and the content of the end pointer is set to be (m+2).

An operation of recording data will be briefly described below using practical examples. In this case, it is assumed that the chain of unused blocks is the chain shown in FIG. 3A.

Figure 3A:
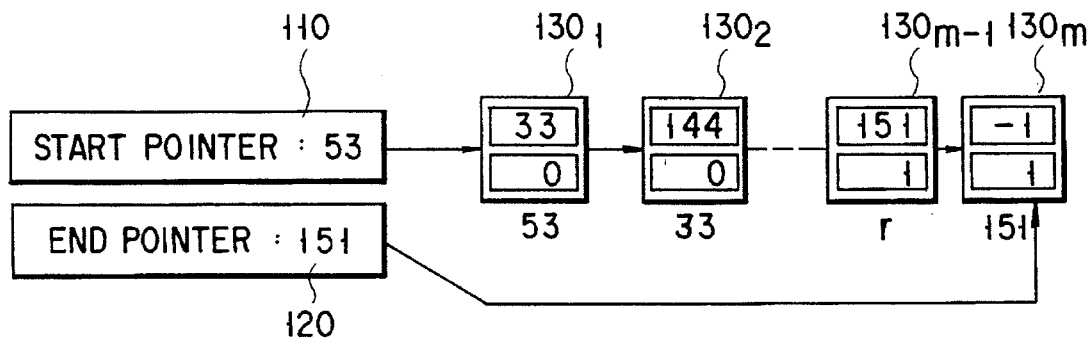
FIGS. 3A to 3C are views for explaining operations of tables for managing unused blocks in the first embodiment.
Figure 3B:
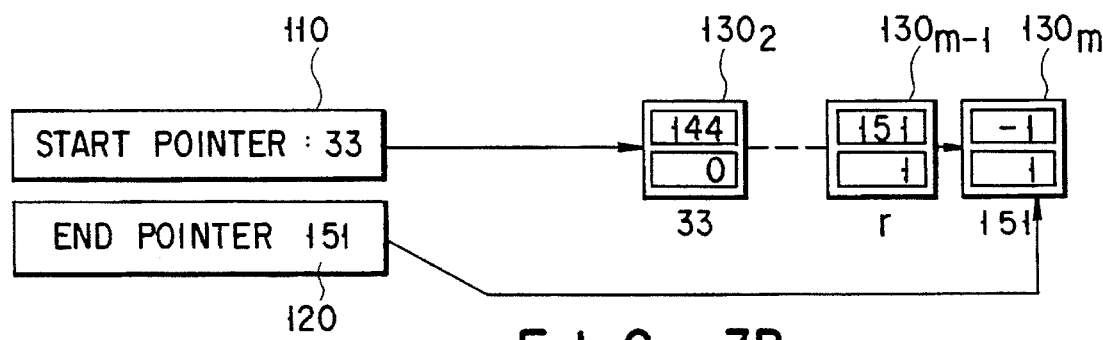

When data is recorded, first, the content of the start pointer of a table 110 is referred. In FIG. 3A, since a 53th table $130_1$ is pointed, the physical block address on the programmable NAND-type EEPROM module 1 is an address 51 obtained by decrementing the address 53 by an offset value of 2. When write access is performed to the block 51, the value of the table 110 is reset to a 33rd table $130_2$ serving as the destination pointer of the table $130_1$. The table $130_1$ corresponding to the block 51 is removed from the chain. The result of the operation is shown in FIG. 3B.

Figure 3C:
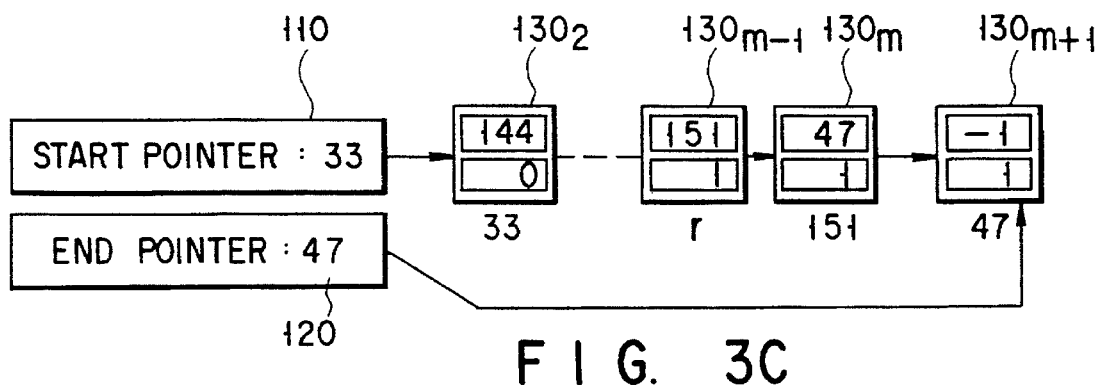

When the data of an existing block is unnecessary in accordance with the write access during the write access, an operation of updating the table is performed as shown in FIG. 3C. In this case, it is assumed that a block in which the unnecessary data is recorded is a block 45.

The table $130_m$ is not an end, but the block 45 is the end. For this reason the pointer of the table $130_m$ is set to a table number 47 corresponding to the block 45. At the same time, the pointer of a table 120 is reset from a table 151 to the table 47. The pointer of a table $130_{m+1}$ newly added to the chain is set to be "−1" representing an end, and the erase flag thereof is set to be "1" representing a non-erased state.

Since the latest block added to the chain of unused blocks is not erased, when read/write access is stopped, an erasure operation is performed while the chain is sequentially retraced, and the erase flag of the table corresponding to the block is set to be "0".

The reference table shown in FIG. 4 will be described below. A length n of the table is set to be smaller than the total member of blocks of the NAND-type EEPROM module 1. For descriptive convenience, it is assumed that the NAND-type EEPROM module 1 is constituted by one 4-Mbit EEPROM. In this case, since the capacity of one block has 4 kbytes, the total number of blocks is 128, the number n of items of the reference table is equal to or smaller than 128.

In this memory device, a data amount corresponding to the capacity of one block of the NAND-type EEPROM module 1 is used as a unit, and physical positions in the NAND-type EEPROM module 1 are allocated. That is, one item of the table represents a physical position where 4-kbyte data is actually recorded. In the table in FIG. 4, a third item 203 of the table represents that 4 kbytes from the 8-kbyte-th address (to be referred to as "logical address" hereinafter) designated by the host system is actually allocated to the 101st block of the NAND-type EEPROM module 1. An item such as a first item 201 or a second item 202 in which "−1" is written represents that allocation of a physical area is not performed yet because write access is not performed to a logical address corresponding to the position of the item.

An operation of the memory device arranged as described above according to the first embodiment will be described below.

The host system (not shown) sets a start access address in the address register 4 in the host interface 2 of FIG. 1, sets the sector length of data to be accessed in the count register 5, and finally sets an instruction such as read/write instruction in the command register 6, when an access instruction is written in the command register 6 of the host interface 2, the CPU 14 in the controller loads the instruction in the command register 6 and performs a series of control programs for performing a command stored in the control program ROM 16.

In the following description, it is assumed that the sector length designated by the host system is equal to the page length of the EEPROM module 1.

FIG. 5 is a flow chart showing a sequence of reading out data from the EEPROM module 1.

The CPU 14 determines a physical address of the EEPROM module 1 in which read access must be performed with reference to the start address set in the host interface 2 and an address translation table in the management table (step A1). The CPU 14 reads out data from the EEPROM module 1 into the data buffer 10 (step A2). Error processing (to be described later), data transfer from the data buffer 10 to the host system, and the like are performed (steps A3 to A5).

FIG. 6 is a flow chart showing a sequence of reading out data from the EEPROM module to the data buffer.

The CPU 14 accesses the EEPROM module 1 through the multiplexer 9, sets the EEPROM module 1 in a read mode, and sets the data buffer 10 in a read mode (steps B1 and B2). The physical address of the EEPROM module 1 subjected to readout is set in the address generator 13 (step B3). An area in which the readout data is to be stored is determined, and a start address of the area is set as a write address for the data buffer 10 in the data buffer 10 (step B4). Thereafter, the CPU 14 sends a command to the control logic circuit 11 such that the control logic circuit 11 performs a predetermined sequence for data read access.

The control logic circuit 11 sets the multiplexer 9 such that the readout data from the EEPROM module 1 is supplied to the data buffer 10, and the control logic circuit 11 reads data of one sector and increments the content of the address generator 13 (step B5). The control logic circuit 11 controls the ECC generator/checker 12 such that an error is detected by using the data and an ECC code read out during read access of the data. When the data of one sector is read out, the CPU 14 checks the ECC generator/checker 12 to check the error of the data (step B6). When no error is detected, or a correctable error is detected, the data is transferred from the data buffer 10 to the host system. If the incorrectable error is detected, the data is not transferred to the host system. In addition, the CPU 14 sets a code representing that an error has occurred in the status register 7 in the host interface 2 and sets a code representing the content of the error in the error register 8, and the CPU 14 informs the host system that the execution of the command is abnormally ended, thereby ending the processing (steps B7 to B10).

Figure 7:
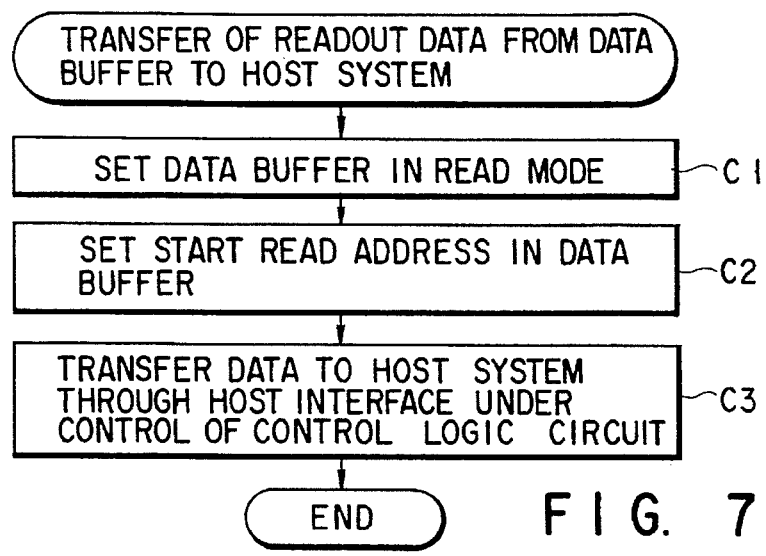
FIG. 7 is a flow chart for explaining read processing of data from a data buffer to a host system in the first embodiment.

FIG. 7 is a flow chart showing a sequence of transferring data from the data buffer to the host system.

In the CPU 14, the start address of an area in which readout data is stored is set in the data buffer 10 as a read address from the data buffer 10 (steps C1 and C2). The CPU 14 commands the control logic circuit 11 to transfer data of one sector to the host system. The control logic circuit 11 controls the data buffer 10 and the host interface 2 to transfer the data of one sector to the host system (step C3). This operation is ended, the address register 4 is incremented by one sector, the value of the count register 5 is decremented by one, and the control logic circuit 11 informs the CPU 14 of the end of transfer. Until all data to be transferred are transferred to the host system, the CPU 14 repeats the above control. When all the readout data are transferred, the CPU 14 sets a code representing no error in the status register 7 in the host interface 2, and the CPU 14 informs the host system of the end of the execution of the instruction, thereby ending the processing.

Figure 8A:
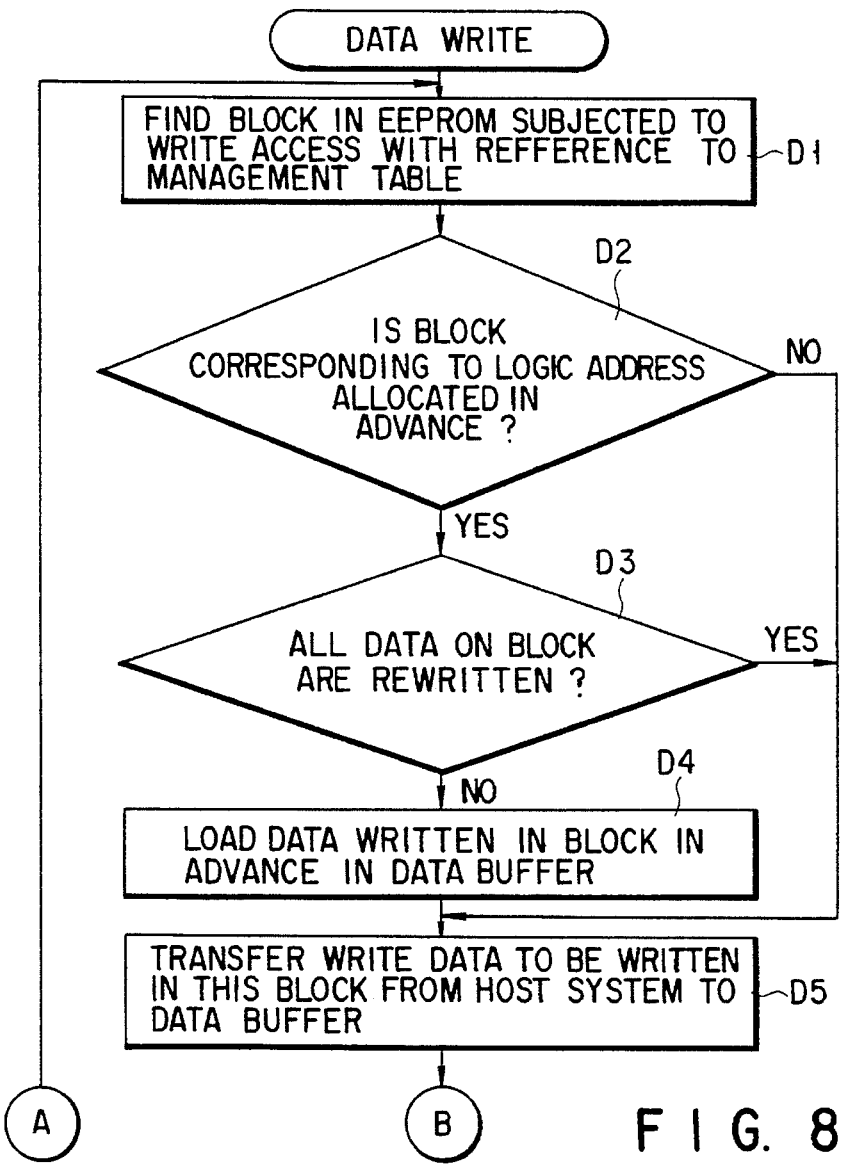

FIGS. 8A and 8B are flow charts showing a sequence of writing data in the EEPROM module 1.

With reference to the start address set in the host interface 2 and the address translation table in the management table, the CPU 14 finds a block, in the EEPROM module 1, which is allocated to an address subjected to write access by the host system (step D1). When the block in the EEPROM module 1 which corresponds to the address designated by the host system is allocated in advance, and a request from the host system does not rewrite all the data of the block, non-rewritable data in the block is loaded in the data buffer 10 (steps D2 to D4).

The sequence of reading out data from the EEPROM module 1 to the data buffer 10 has already been described using the flow chart in FIG. 6. Until all data of a non-overwritten area in the block are loaded in the data buffer 10, the processing in FIG. 6 is repeated. Transfer of write data from the host system to the data buffer 10 (to be described later) and write and error processing of data from the data buffer 10 to the EEPROM module 1 are performed (steps D5 to D11).

FIG. 9 shows a sequence for transferring write data from the host system to the data buffer.

The CPU 14 sets the data buffer 10 in a write mode (step E1), and sets, as a write address to the data buffer 10, an address in the data buffer 10 in which the data transferred from the host system is stored (step E2). Thereafter, the CPU 14 commands the control logic circuit 11 to transfer data of one sector from the host system. The control logic circuit 11 controls the data buffer 10 and the host interface 2 to receive the data of one sector from the host system. When this control is ended, the control logic circuit 11 informs the CPU 14 of the end of data transfer (step E3).

The processing is continuously performed when data to be transferred from the host system is left and when data for a block subjected to write access of the EEPROM module 1 is short in the data buffer 10. When the transfer from the host system is ended, the CPU 14 refers the start address set in the host interface 2 and the table for unused blocks and retraces the chain of the unused blocks as described above to determine an unused block, in the EEPROM module 1, in which the data of one block stored in the data buffer is to be written, thereby performing write access to the EEPROM module 1.

Figure 10:
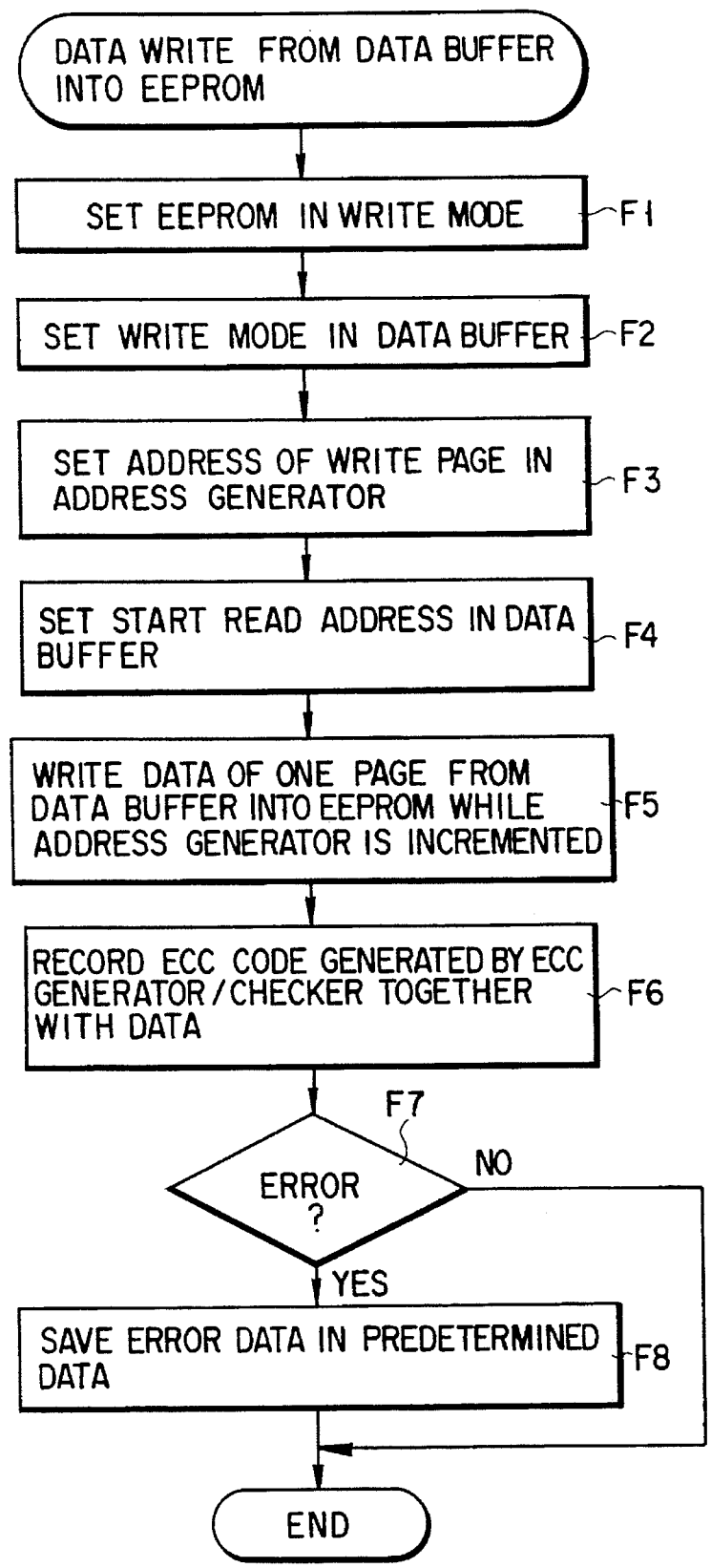
FIG. 10 is a flow chart for explaining write processing of data in the data buffer into the EEPROM module.

FIG. 10 is a flow chart showing a sequence in which data of one page in the data buffer is written in the EEPROM module.

After the CPU 14 initializes the EEPROM module 1 and the data buffer 10 as needed (steps F1 and F2), and sets the start address of a page subjected to write access in the address generator 13 (step F3). The start address of data to be written is set in the data buffer 10 as the read address of the data buffer 10 (step F4). The CPU 14 commands the control logic circuit 11 to perform a predetermined sequence for writing data. The control logic circuit 11 sets the multiplexer 9 such that the write data from the data buffer 10 is supplied to the EEPROM module 1, and writes the data in the EEPROM module 1 while the content of the address generator 13 is incremented (step F5).

The CPU 14 controls the ECC generator/checker 12 such that an ECC code is generated by the data, and the code is recorded in the EEPROM module together with the data (step F6). The processing up to step F6 is continued until a write access error is generated or the write access of data of one block is ended (step F7). When the write access of the data cannot be normally performed, error processing is performed, the block, in the EEPROM module 1, in which the data of one block are to be written is allocated again, and the write access is performed again. When the write access is normally ended, the content of the management table is updated.

When all data required by the host system are recorded, or the processing is interrupted due to impossible error recovery, the CPU 14 sets a predetermined code in the status register 7 in the host interface 2, and informs the host system of the end of execution of the instruction. At a proper timing when no access instruction is written in the command register 6 of the host interface 2, the CPU 14 sequentially erases the unused blocks while the chain of the management table of the unused blocks is retraced.

In the first embodiment, the EEPROM module is controlled through the host interface by a controller operative parallelly to the host system. However, the EEPROM module 1 may be directly controlled by the CPU of the host system.

FIGS. 11, 12, 13A–13B, 14, 15, 16, 17A–17F, and 18A–18F are views showing the second embodiment of the present invention.

FIG. 11 shows the arrangement of storage areas in an EEPROM serving as a memory means. In FIG. 11, although the number of storage areas 331 to 336 divided in capacities serving as management units is the same as that of erasure units or is an integer multiple of the number of erasure units to easily handle the storage areas 331 to 336, the number of storage areas is not limited to this number. In the second embodiment, although the unit storage area is referred to as only a block hereinafter, the unit storage area may be regarded as a block serving as an erasure unit of a NAND-type EEPROM. The unit storage area is not limited to the erasure unit. Numbers given to blocks are used for ordering the blocks, although the numbers are conveniently given in a physical address order, the numbers may be given in a logical order in accordance with a specific rule. For descriptive convenience, it is assumed herein that a memory means used in this description is constituted by 6 blocks.

FIG. 12 is a table for managing write access to the blocks 331 to 336. Each of items 311 to 316 representing the states of the block 331 to 336 is constituted by, as shown in FIG. 12, three flags 321 to 323. That is, the flag (to be referred to as an "erase flag" or "E flag" hereinafter) 321 serving as a first managing means for performing management such that write access of data to the blocks is circulated in one direction in accordance with an order of blocks with reference to the first managing means and a valid flag; the flag (to be referred to as a "change flag" or "C flag" hereinafter) 322 serving as a second managing means for managing whether data recorded in a block is changed or not after a certain time in the presence of data in the block; and the flag (to be referred to as a "valid flag" or "V flag") 323 serving as a third management means for managing whether significant data is recorded in a block.

A write scheme according to the second embodiment will be described below with reference to FIGS. 13A to 18F. In order to read out written data, a means for managing correspondence between the tag (e.g., a file name) of the written data and a position in which the data is written is required. However, since a method performed in a normal file system (OS) can be applied as the write scheme, a description of the write scheme will be omitted in this embodiment.

Figure 13A:
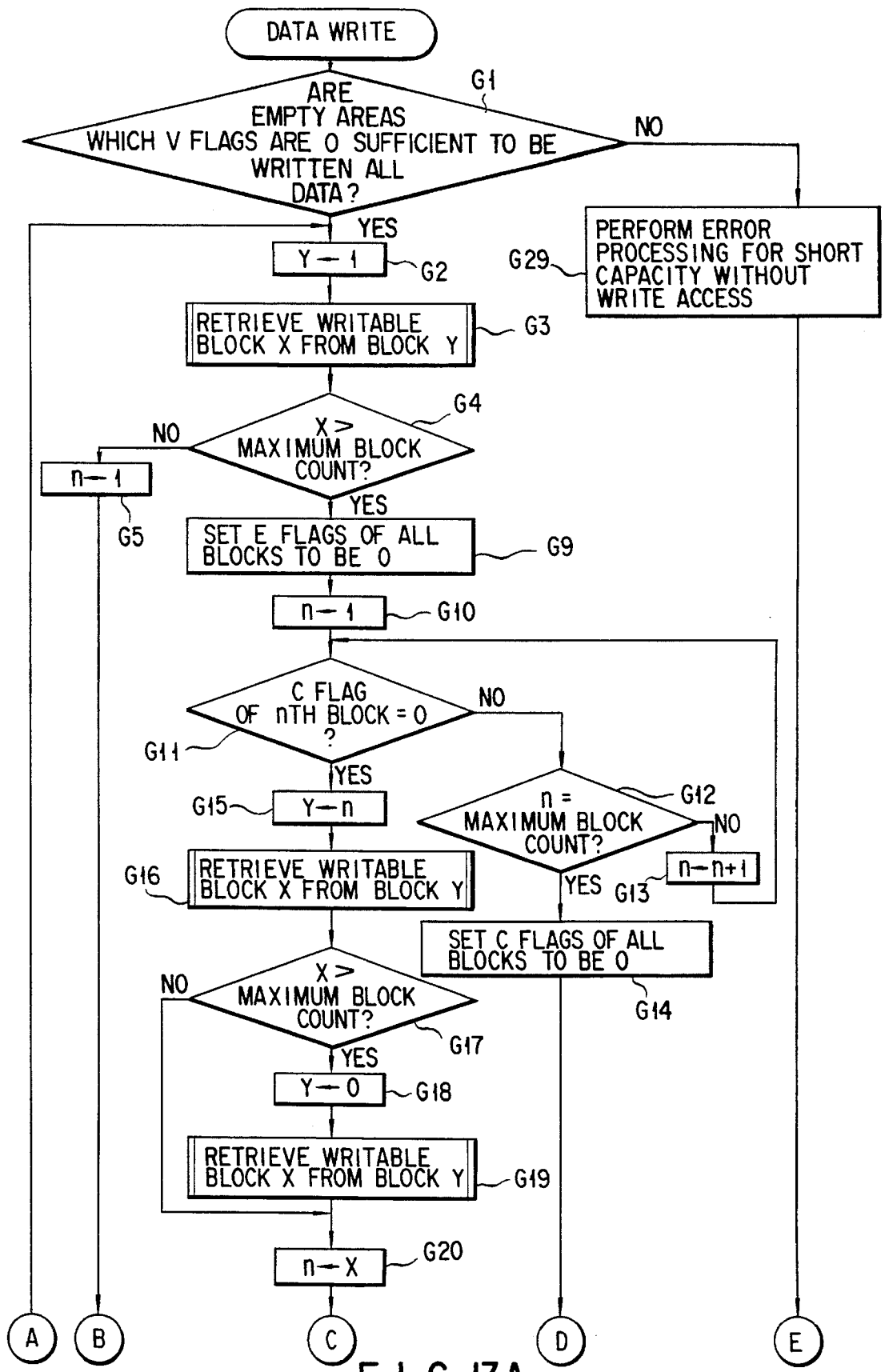
FIGS. 13A to 13B are flow charts showing a sequence of writing data in a storage area in the second embodiment.
Figure 13B:
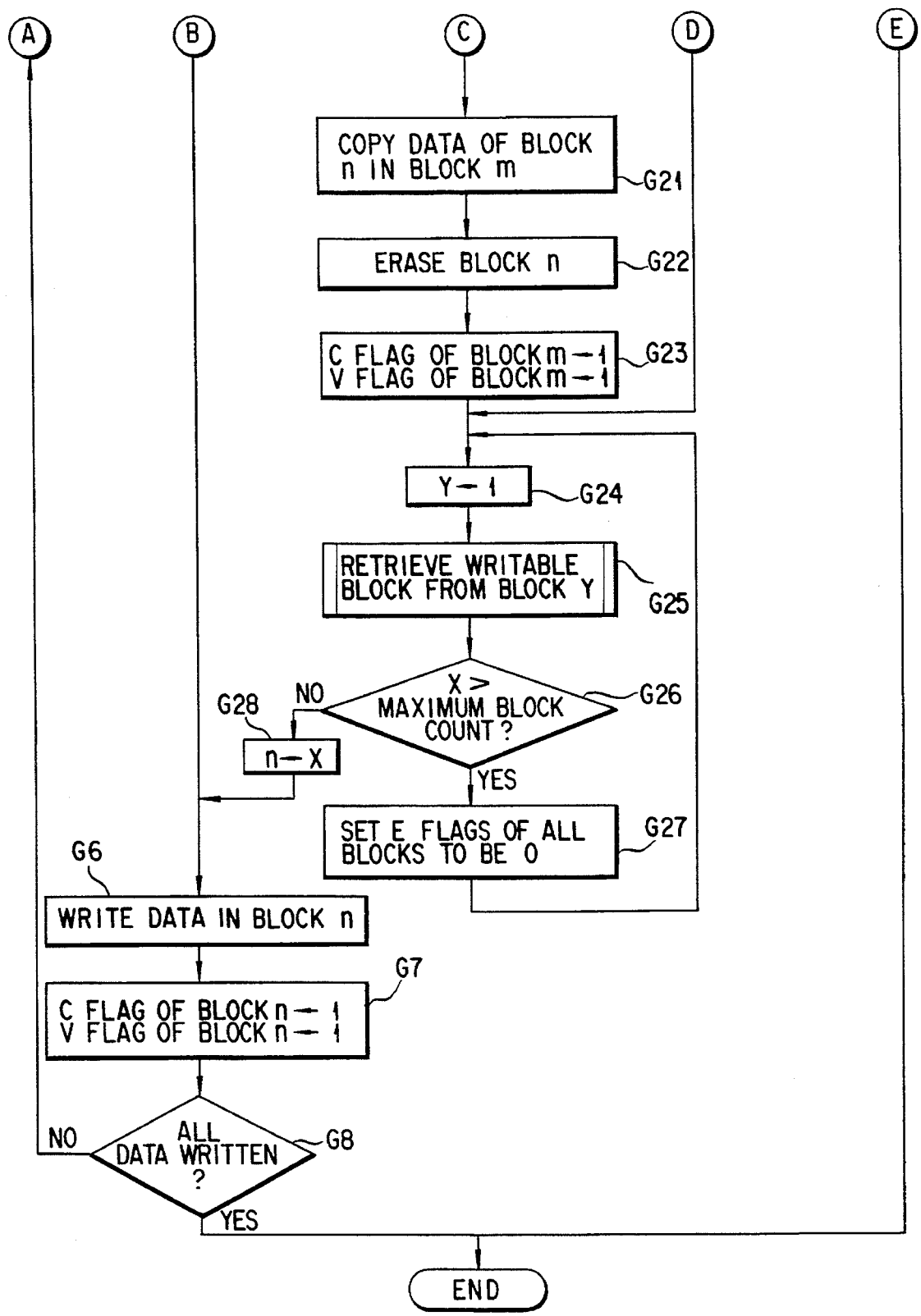

FIGS. 13A and 13B are a flow chart showing a data write sequence, FIG. 14 is a flow chart showing a data erase sequence, and FIG. 15 is a flow chart showing a data rewrite sequence. FIGS. 17A to 17F and FIGS. 18A to 18F are views for simultaneously explaining changes in states of the storage areas shown in FIG. 11 and the table (FIG. 12) for managing the storage areas. The changes are caused by writing data. The blocks indicated by hatched lines and indicating the storage areas in FIGS. 17A to 17F and FIGS. 18A to 18F represent areas in which valid data are written.

Figures 17A, 17B, 17C, 17D, 17E, 17F:
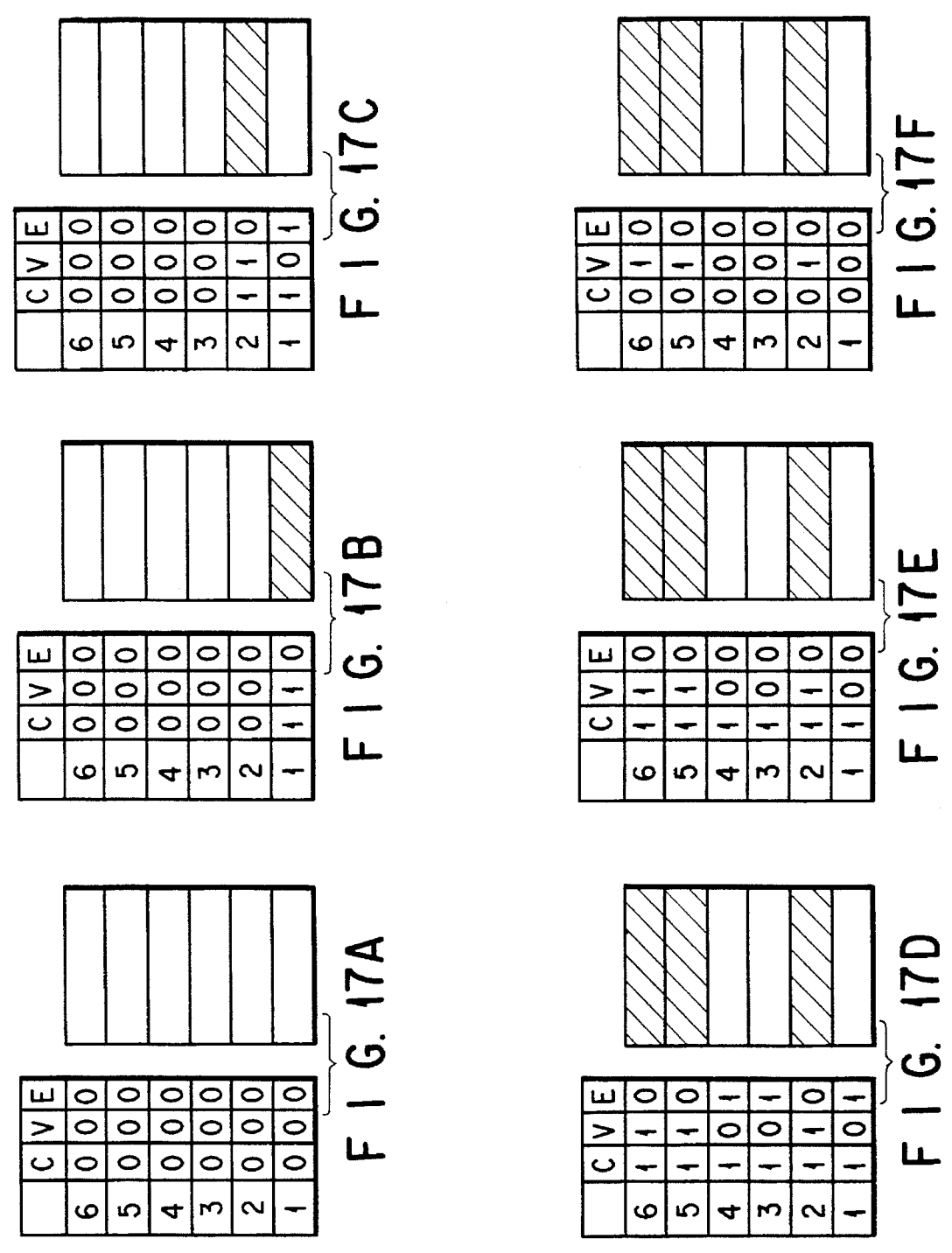

Before a memory device is used, as shown in FIG. 17A, it is assumed that all the flags are initialized to be "0". A case wherein write access to a block is performed in this state will be described below.

In step G1 in FIG. 13A, it is checked whether a necessary capacity is available. In the scheme according to the second embodiment, since write access is performed to only "0" blocks by both a V flag for managing whether significant data is recorded and an E flag for managing circulation in one direction, a block matched with this condition is retrieved (steps G2 and G3 in FIG. 13A and steps H1 to H4 in FIG. 16). After it is confirmed that the block is matched with the condition, data is written in the first block (steps G4 to G6 in FIG. 13A), and a C flag and the V flag are set to be "1" (step G7 in FIG. 13A; FIG. 17B). When the currently written data is immediately rewritten, the V flag of the first flock is changed to "0", and the E flag is changed to "1" in accordance with the sequence in FIG. 14. The data is written in the second block retrieved in the same sequence as that of the first write access (FIG. 17C).

Although the first block is set in a logically erased state with the above operation, an electric erasure operation of the first block must be additionally performed. The electric erasure operation is preferably performed on the background in consideration of a processing speed. However, this method essentially departs from this embodiment, and a description thereof will be omitted. In the following description, it is assumed that electric erasure operations are performed to these blocks by a certain method before data are written in the blocks.

When the above write processing is continued, a state, e.g., the state shown in FIG. 17D, wherein data is uniformly written in the entire memory in an order of the block numbers is obtained. In this case, for example, when data of one block is to be written, retrieving in step G3 of FIG. 13A has failed although there is an empty area. A state wherein the retrieving has failed indicates that a uniform write cycle for the empty areas of the blocks is ended. Therefore, the E flags of all the blocks are cleared to be "0" to control the next write cycle in one direction (step G9 in step 13A; FIG. 17E).

Figure 18A:
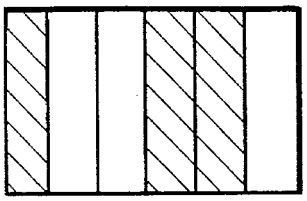

In addition to the uniform write access in one direction, the characteristic feature of the second embodiment is that data kept stored in the same position for a long time is moved. In order to achieve the characteristic feature, proper movement timings related to a write count are required. As one of the timings, a timing when all the E flags are cleared is used. In FIG. 13A, when the C flags are examined by the processing in steps G10 to G13 at this timing, data to be moved is selected. In FIG. 17E, all the C flags are set to be "1". This state indicates that all the blocks are rewritten at least once from the time when the C flags are initialized to the time when the C flags are set in the state of FIG. 17E. In this case, since data which occupies the same block for a time longer than that of any other data is not determined, initialization is performed again in step G14 (FIG. 17F). Thereafter, data is written in the a for starting the series of processing operations (steps G24 to G28 in FIG. 13B; G6; FIG. 18A).

Figure 18B:
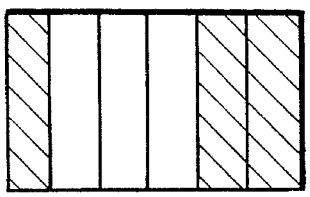
Figure 18C:
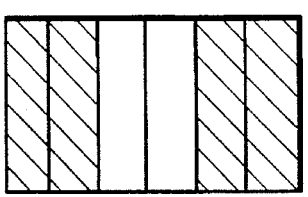
Figure 18D:
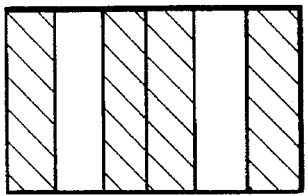
Figure 18E:
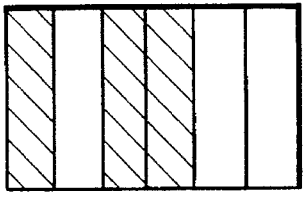
Figure 18F:
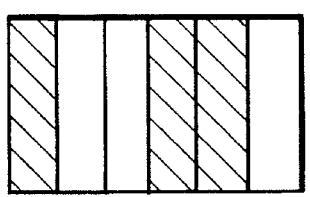

Assume that the data of the fifth block is erased to obtain the state in FIG. 18B, and that write access to the third block and an erasure operation of the first block are performed to obtain the state in FIG. 18C. In this state, a case wherein write access to the first block is performed as the final write pattern at this timing will be considered as follows. Since one rewrite cycle is ended, retrieving of a writable area has failed, all the E flags are cleared (FIG. 18D). Although the C flags are examined, since the C flag of the second block is set to be "0", the data of this block is determined as data which is not rewritten for a relatively long time, and the data is to be moved. In accordance with the sequence in steps G15 to G20 in FIG. 13A, a destination write block for the data is circulated and retrieved in a direction of performing write access using a start point as the block in which the data to be moved is stored. In this example, the fourth block corresponds to the destination block. After the data of the second block is copied to the fourth block, the data of the second block is erased (steps G21 to G23 in FIG. 13B; FIG. 18E). In this manner, the data which has occupied the second block from the timing of FIG. 17C is moved, and the second block is set in a rewritable state.

As a sequential operation, data of one block required at the timing of FIG. 18C is written in an empty block. However, when a writable block is retrieved by the same method as that of normal write access, the retrieving may fail a case wherein there is only one empty block at the timing of FIG. 18C. At this time, data to be moved is set in the empty block, and the E flag of a block in which the data to be moved is originally set is set to be "1". For this reason, the block is not retrieved. Therefore, as described in step G27 of FIG. 13B, all the E flags must be cleared. When the E flag of the block in which the data to be moved is originally set is controlled to be kept at "0", the block can be retrieved. Although there is another empty block, the block immediately after the data is moved is retrieved as a rewritable block, and an electric erasure operation of the background may not be performed on time.

The third embodiment of the present invention is shown in FIGS. 19 to 23.

In the third embodiment, it is assumed that a 4-Mbit NAND-type EEPROM is used as a nonvolatile semiconductor memory. In order to briefly describe the main point of the third embodiment, a logical management unit of a storage area corresponding to an MS-DOS cluster coincides with a block serving as an erasure unit of the NAND-type EEPROM. In this embodiment, a user file, a table for managing a recording position of the file, and a pointer, of hierarchical pointers to the table, which does not have a fixed position are not required to be recorded in a specific area of the storage area, so that the file, the table, and the pointer must be controlled such that write access is distributed in the entire storage area as widely as possible. However, this embodiment aims at describing a method in which a table for managing the position of a file need not be fixed in the specific area of the storage area. Therefore, although it is assumed that distribution write control is performed, a description thereof will be omitted.

Figure 20:
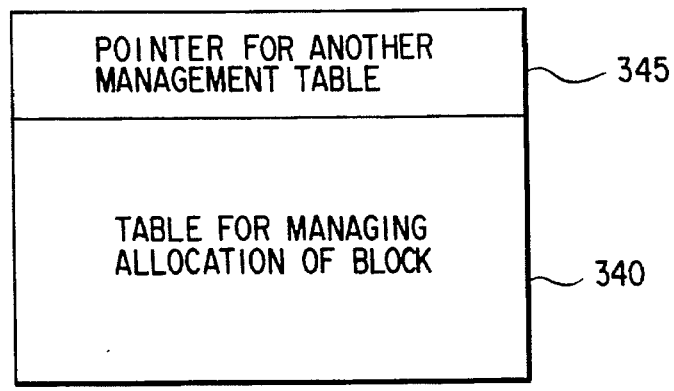
FIG. 20 is a view showing the arrangement of the route management table in the third embodiment.

FIG. 20 shows a block constituting one table for managing a position at which a file is recorded. In FIG. 20, the table is assumed to be called a route management table. In FIG. 20, in a table 340, having the same arrangement of an FAT of MS-DOS, for managing a block allocation state of the entire storage area, according to this embodiment, not only a block in which a user file is recorded but a block in which management data such as file management table itself and the pointer of the file management table are recorded are moved. For this reason, the allocation of these blocks is managed. The pointer 345 in FIG. 20 is assumed to be a pointer representing the position of an additional block used when block allocation data cannot be stored in this block, and the positions of a file name corresponding to a directory of MS-DOS, a management table related to data added to the file name, or the like. That is, when the management table shown in FIG. 20 can be accessed, all the data related to file management can be accessed.

Figures 21A, 21B:
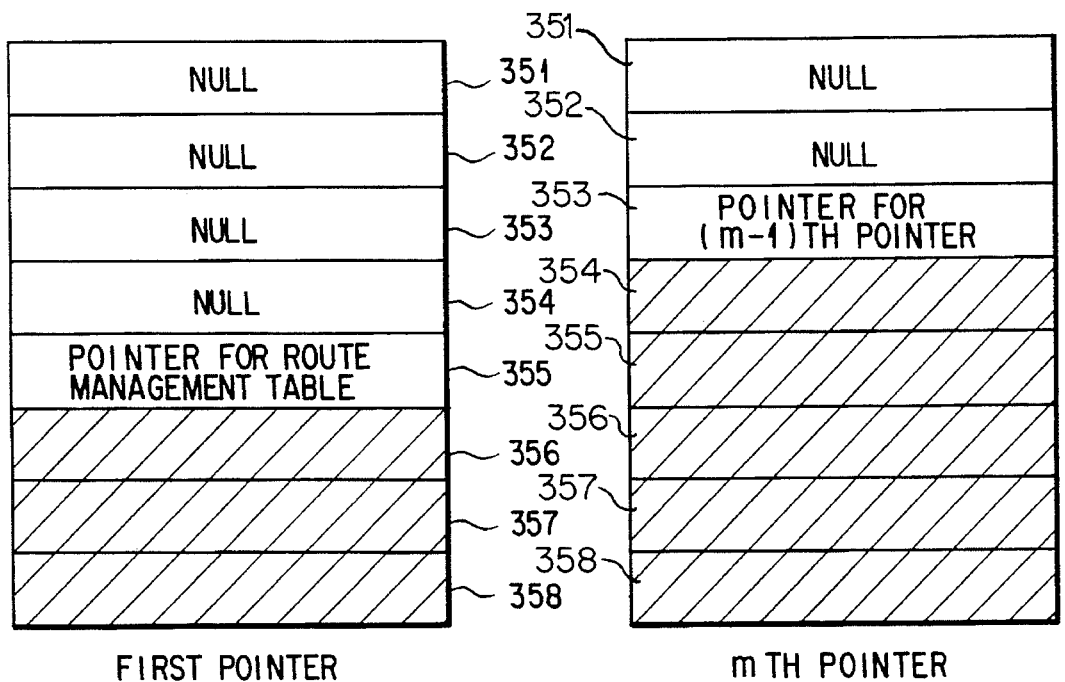
FIGS. 21A and 21B are views showing blocks in which pointers are recorded in the third embodiment.

FIGS. 21A and 21B show blocks in which pointers are arranged such that positions of the recorded data are hierarchically represented to indicate the positions at which the route management table is recorded.

Pages 351 to 358 in FIG. 21A represent the pages of a NAND-type EEPROM, the page 358 represents a page on a source side, and the page 351 represents a page on a drain side. Each of the pointers has a data amount within one page, and write access is sequentially performed from the pointer on the source side in accordance with a write rule of the NAND-type EEPROM. Each of the pages 356 to 358 indicated by hatched lines and shown in FIG. 21A represents that an updated pointer is written, and "NULL" in each of the pages 351 to 354 represents that data is set in an erased state. In the block in which the first pointer in FIG. 21A is stored, the data in the page 355 represents the position of the route management table.

The block in which the m-th pointer in FIG. 21B is stored represents the position of the (m−1)th pointer with the same arrangement as that of FIG. 21A. When the number of pointers (the number of hierarchical levels) is set to be n, the first to (n−1)th pointers may be recorded on any position of a recordable area, and these pointers are accessed by sequentially retracing the pointers of a plurality of levels. Only the n-th pointer (to be referred to a route pointer) is recorded at a fixed position of the storage area. FIG. 19 shows relationships between the pointers fixed in the plurality of levels.

FIG. 22 is a flow chart showing the sequence of processing performed in accordance with a change in route management table required in a file management scheme according to the third embodiment. The content of the route management table is loaded on a RAM in advance to be developed. After the route management table is updated in the RAM, the route management table is written again.

Figure 23:
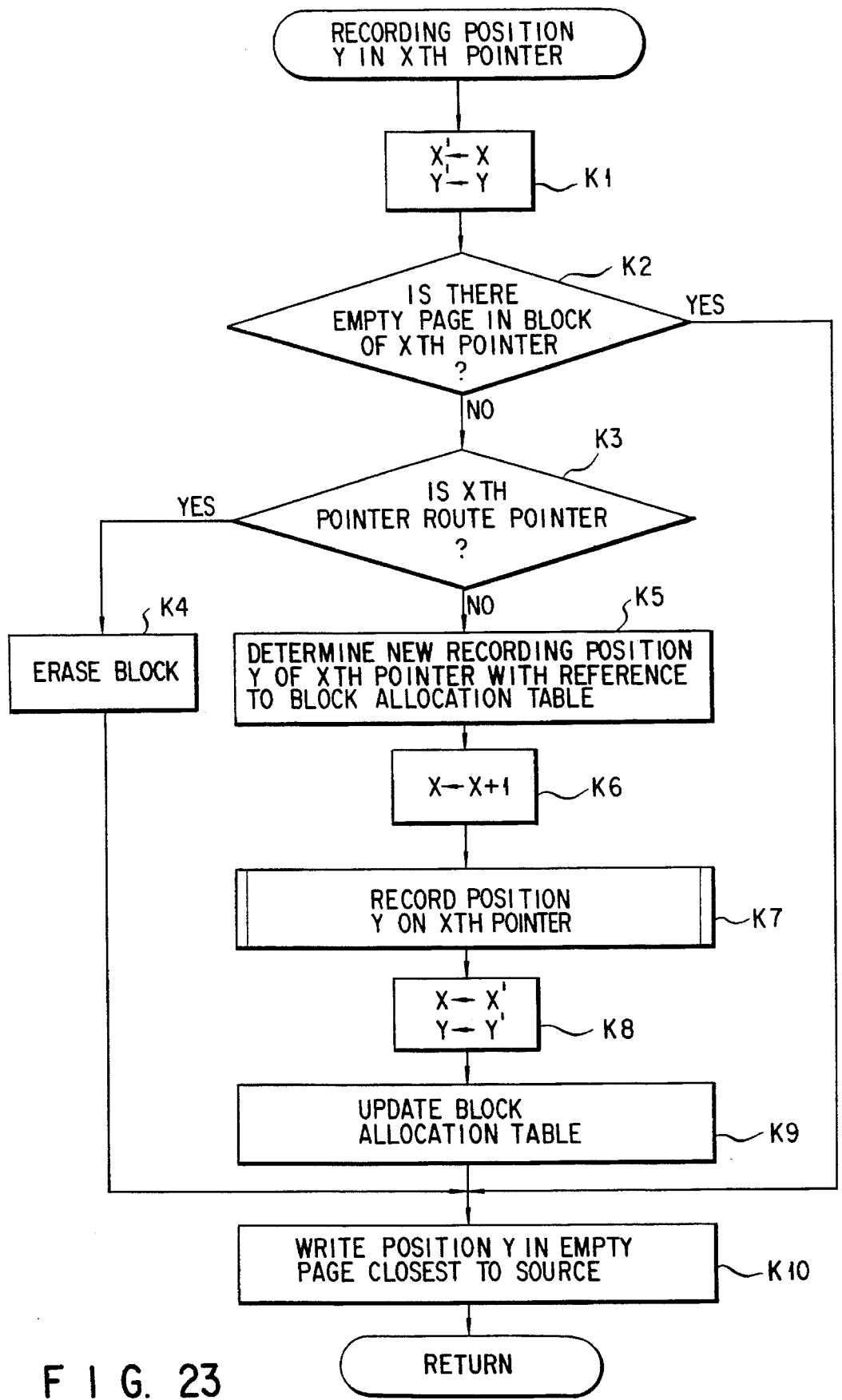
FIG. 23 is a flow chart showing a sequence for setting a block position in a pointer in the third embodiment.

First when block allocation is changed due to write access of a file or the like, the position of a block for writing the changed route management table again is determined with reference to the block allocation table (step J1). This position is set in a pointer, and write access is performed after the allocation table is updated (steps J2 to J5). Steps K1 to K10 in the flow chart of FIG. 23 represent a sequence of setting block positions in hierarchically arranged pointers. This sequence is recursively called to change the setting of the hierarchically arranged pointers.

A method of determining the number n of hierarchical levels of the pointers will be actually described below. The content of route management table is updated every time block allocation is changed by writing a file. The updated table itself is written in another block to prevent write access from being concentrated on a specific block. Since the position of the route management table is changed, the recording position of the first pointer is updated. Since the pointer can be updated 8 times (for 8 pages) in the same block, one write cycle is performed by changing the blocks 8 times caused by writing the file in a block in which the first pointer is stored, and the position of the table is changed by the 9th updating operation of the block. In a block in which the second pointer is stored, as in the block in which the first pointer is stored, it can be estimated that one rewrite operation is performed by writing files 64 times. If the total capacity of a nonvolatile memory device has 20 Mbytes, since the capacity per one block has 4 kbytes, the total number of blocks is 5,120. It is assumed that a maximum rewrite count of an EEPROM is set to be C, when write access is uniformly performed to these blocks, rewriting of $$5120 \times C \text{ blocks}$$

can be performed. When one block of a management table is rewritten for one rewriting operation of a file of one block, since the two blocks are rewritten at the same time, the maximum block allocation count is given as follows:

$$5120 \times C/2 = 2560 \times C$$

One rewriting operation of a fixed block in which the n-th pointer is recorded is performed each time a change in block allocation is performed $8^n$ times. Since this fixed block can be rewritten C times at most, when the change in block allocation is performed $$8^n \times C = 2^{3n} \times C$$

times at most, the maximum rewrite count of the fixed block does not reach its limit before other blocks reaches their limits. Therefore, the number n of necessary hierarchical levels is given by:

$$2^{3n} \times C = 2560 \times C$$
$$n = \log_2 2560/3$$
$$\approx 4$$

As described above, according to the third embodiment, a recording position is not fixed in the memory means of a frequently rewritten management table, and pointers representing the position of the management table are hierarchically arranged in a plurality of levels to be recorded. For this reason, the maximum rewrite count of the pointers which are recorded at fixed positions to retrieve the pointers is not limited to the maximum rewrite count of other areas, and write access is not concentrated on a specific area, thereby preventing the service life of the memory from being ended for a short time.

Various changes and modifications may be effected without departing from the spirit and scope of the invention.

Additional advantages and modifications will readily occur to those skilled in the art. Therefore, the present invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A nonvolatile semiconductor memory device using an EEPROM, comprising:

memory means having a memory cell array divided into a plurality of blocks;

managing means for managing unused blocks of said plurality of blocks in which new data is to be written, said unused blocks including erased blocks, which are physically erased, and non-erased blocks, which are logically erased but are not physically erased;

erasing means for discriminating said erased blocks of said unused blocks from non-erased blocks of said unused blocks and erasing data stored in said non-erased blocks; and control means for writing data into at least one block of said erased blocks of said unused blocks managed by said managing means, wherein in case that said data written by said control means is generated by changing data recorded in a different block of said memory means when said data recorded in said different block is not necessary, said control means informs said managing means that said different block is a non-erased block, and when said data recorded in said different block is necessary, said control means copies said data recorded in said different block to one of said erased blocks in which new data is to be written.

2. A device according to claim 1, wherein said managing means forms a chain of unused blocks by chaining said erased and non-erased blocks, and includes a first table for storing a pointer to a first block of said chain, a second table for storing a pointer to a last block of said chain, each memory block of said chain storing a pointer to a next block of said chain and an erase flag indicating whether said next block has been erased.

3. A memory device according to claim 2, wherein a pointer stored in said last unused block of said chain is set to be −1.

4. A device according to claim 2, wherein said managing means further includes means for adding said different block to an end of said chain of said unused blocks when said control means informs said managing means that said different block is a non-erased block.

5. A device according to claim 2, wherein said erasing means includes means for sequentially erasing data of said non-erased blocks by retracing said chain of said unused blocks via said managing means.

6. A device according to claim 1, wherein said erasing means includes means for informing said managing means that data of a non-erased block has been erased when the data of said non-erased block is erased by said erasing means.

7. A device according to claim 1, wherein said control means includes means for sequentially writing data to said erased blocks on the basis of an order in which said erased blocks are arranged in said chain of unused blocks.

8. A device according to claim 1, wherein said memory cell array includes a plurality of memory cells connected in series to form NAND-type memory cells.

9. A device according to claim 1, wherein said managing means forms a chain of unused blocks by chaining tables corresponding to said erased and non-erased blocks, and includes a first table for storing a pointer to a table corresponding to a first block of said chain, a second table for storing a pointer to a table corresponding to a last block of said chain, a plurality of third tables corresponding to said unused blocks of said chain, each of which stores a pointer to a next table corresponding to a next block of said chain, and an erase flag indicating whether said next block has been erased.

10. A device according to claim 9, wherein said managing means further includes means for adding said different block to an end of said chain of said unused blocks when said control means informs said managing means that said different block is a non-erased block.

11. A device according to claim 9, wherein said erasing means includes means for sequentially erasing data of said non-erased blocks by retracing said chain of said unused blocks via said managing means.

12. A system according to claim 9, wherein said managing means includes means for arranging a last unused block at the end of said chain of unused blocks.

13. A system according to claim 12, wherein said chain of unused blocks has an end mark indicating said last unused block of said chain of said unused blocks.

14. A system according to claim 13, wherein said end mark is set as −1 indicating a state in which all of said memory cells are erased.

15. A system according to claim 9, further comprising means for discriminating erased blocks of said unused blocks from non-erased blocks of said unused blocks.

16. A memory system including a nonvolatile semiconductor memory device, comprising:

memory means having an array of memory cells divided into a plurality of blocks including unused blocks, said unused blocks comprising erased blocks, which are physically erased, and non-erased blocks, which are logically erased but are not physically erased;

erasing means for discriminating said erased blocks of said unused blocks from said non-erased blocks of said unused blocks and erasing data stored in said non-erased blocks; and control means for writing data to said unused blocks on the basis of an order in which said unused blocks are arranged.

17. A system according to claim 16, further comprising managing means for managing said unused blocks of said plurality of blocks by chaining said unused blocks to form a chain of said unused blocks, and wherein said control means sequentially writes data to said unused blocks on the basis of an order in which said unused blocks are arranged in said chain.

18. A system according to claim 17, wherein said managing means includes means for arranging a last unused block at the end of said chain.

19. A system according to claim 18, wherein said chain has an end mark indicating said last unused block of said chain of said unused blocks.

20. A system according to claim 19, wherein said end mark is set as −1 indicating a state in which all of said memory blocks are erased.

21. A system according to claim 17, further comprising means for discriminating said erased blocks of said unused blocks from said non-erased blocks of said unused blocks.

* * * * *